US009263555B2

(12) United States Patent
Pawlak et al.

(10) Patent No.: US 9,263,555 B2

(45) Date of Patent: Feb. 16, 2016

(54) METHODS OF FORMING A CHANNEL REGION FOR A SEMICONDUCTOR DEVICE BY PERFORMING A TRIPLE CLADDING PROCESS

(71) Applicant: GLOBALFOUNDRIES Inc., Grand Cayman (KY)

(72) Inventors: Bartlomiej Jan Pawlak, Leuven (BE); Behtash Behin-Aein, Campbell, CA (US); Mehdi Salmani-Jelodar, West Lafayette, IN (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 15 days.

(21) Appl. No.: 14/322,987

(22) Filed: Jul. 3, 2014

(65) Prior Publication Data

US 2016/0005834 A1 Jan. 7, 2016

(51) Int. Cl.
*H01L 29/66* (2006.01)
*H01L 29/78* (2006.01)
*H01L 21/02* (2006.01)

(52) U.S. Cl.
CPC ...... *H01L 29/6681* (2013.01); *H01L 21/02381* (2013.01); *H01L 21/02532* (2013.01); *H01L 29/785* (2013.01); *H01L 29/66795* (2013.01)

(58) Field of Classification Search
None
See application file for complete search history.

(56) References Cited

U.S. PATENT DOCUMENTS 7,960,791 B2 * 6/2011 Anderson ....... H01L 21/823412 257/349
8,629,478 B2 1/2014 Ko et al.
2008/0318375 A1 * 12/2008 Van Noort ........ H01L 29/66795 438/212
2013/0228863 A1 * 9/2013 Wang ................ H01L 29/66795 257/347
2014/0175512 A1 * 6/2014 Chu-Kung ...... H01L 21/823821 257/190

* cited by examiner

*Primary Examiner* — Mary Wilczewski
*Assistant Examiner* — Erik T Peterson
(74) *Attorney, Agent, or Firm* — Amerson Law Firm, PLLC

(57) ABSTRACT

One illustrative method disclosed herein includes, among other things, forming a plurality of trenches that define a fin, performing a plurality of epitaxial deposition processes to form first, second and third layers of epi semiconductor material around an exposed portion of the fin, removing the first, second and third layers of epi semiconductor material from above an upper surface of the fin so as to thereby expose the fin, selectively removing the fin relative to the first, second and third layers of epi semiconductor material so as to thereby define two fin structures comprised of the first, second and third layers of epi semiconductor material, and forming a gate structure around a portion of at least one of the fin structures comprised of the first, second and third layers of epi semiconductor material.

21 Claims, 17 Drawing Sheets

100 122 120B 120 108 110 120A 112 107 116 116 104 102

METHODS OF FORMING A CHANNEL REGION FOR A SEMICONDUCTOR DEVICE BY PERFORMING A TRIPLE CLADDING PROCESS

BACKGROUND OF THE INVENTION

1. Field of the Invention

Generally, the present disclosure relates to the manufacture of FET semiconductor devices, and, more specifically, to various methods of forming a channel region for a semiconductor device by performing a triple cladding process, and the resulting semiconductor device.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A conventional FET is a planar device that typically includes a source region, a drain region, a channel region that is positioned between the source region and the drain region, and a gate electrode positioned above or around the channel region. Drive current through the FET is controlled by setting the voltage applied to the gate electrode. For example, for an NMOS device, if there is no voltage applied to the gate electrode, then there is no current flow through the NMOS device (ignoring undesirable leakage currents, which are relatively small). However, when an appropriate positive voltage is applied to the gate electrode, the channel region of the NMOS device becomes conductive, and electrical current is stimulated to flow between the source region and the drain region through the conductive channel region. To improve the operating speed of conventional FETs, device designers have significantly reduced the channel length of such devices, which has resulted in improving the switching speed and in lowering operation currents and voltages of FETs. However, decreasing the channel length of a FET also makes it difficult to control the channel region of the device. This is sometimes referred to as a so-called short channel effect, wherein the characteristic of the FET as an active switch is degraded.

In contrast to a planar FET, there are so-called 3D devices, such as an illustrative FinFET device, which is a three-dimensional structure. FIG. 1A is a perspective view of an illustrative prior art FinFET semiconductor device 10 that is formed above a semiconductor substrate 12 that will be referenced so as to explain, at a very high level, some basic features of a FinFET device. In this example, the FinFET device 10 includes a plurality of trenches 14 that define three illustrative fins 16, a cladding material 17 (see FIG. 1B) formed on the fin 16, a gate structure 18, sidewall spacers 20 and a gate cap layer 22. The fins 16 have a three-dimensional configuration: a height H, a width W and an axial length L. The axial length L of the fins 16 corresponds to the direction of current travel in the device 10 when it is operational. The portions of the fins 16 covered by the gate structure 18 are the channel regions of the FinFET device 10. FIG. 1B is a cross-sectional view of the FinFET device 10 taken through the gate structure 18 in a gate width direction of the device 10. The gate structure 18 is typically comprised of a layer of gate insulating material 18A (see FIG. 1B), e.g., a layer of high-k insulating material (k-value of 10 or greater) or silicon dioxide, and one or more conductive material layers (e.g., metal, metal alloy, metal stack and/or polysilicon) that serve as the gate electrode 18B (see FIG. 1B) for the device 10. In the device 10, the cladding material 17 is the primary current carrying portion of the channel region when the device 10 is operational. Typically, with respect to current day technology, the cladding material 17 may have a thickness of about 2-3 nm. The cladding material is typically an epi semiconductor material, such as silicon germanium, that is formed on the fin 16 by performing known epi deposition processes.

As shown in FIG. 1C, one process flow that is typically performed to form the illustrative FinFET device 10 with the cladding material 17 positioned on the fin 16 is as follows. First, a plurality of trenches 14 were formed in the substrate 12 to define the initial fins 16 (only one fin is shown in FIG. 1C). After the trenches 14 are formed, a layer of insulating material 24, such as silicon dioxide, was formed so as to overfill the trenches 14. Thereafter, a chemical mechanical polishing (CMP) process was performed to planarize the upper surface of the insulating material 24 with the top of the fins 16 (or the top of a patterned hard mask). Thereafter, a recess etching process was performed to recess the layer of insulating material 24 between adjacent fins 16 so as to thereby expose the upper portion of the fin 16. At this point, an epitaxial deposition process was performed to form the cladding material 17 on the exposed portion of the fin 16. Additional steps are then performed to complete the fabrication of the device, i.e., gate formation, sidewall spacer formation, epi material growth in the source/drain regions of the device, etc.

While the above-described process flow has worked well for current technology nodes, the use of such methodologies in future device generations is problematic. More specifically, with reference to FIG. 1B, the fin 16 may have a width 16W on the order of about 30 nm or so and it may be readily manufactured using currently available tools and techniques. If the cladding material 17 has a thickness of about 3 nm, then, in this example, the overall width 21 of the channel structure may be about 36 nm. With reference to FIG. 1C, as device dimensions are continually reduced for future technology nodes, the overall allowable width 19 of the channel structure may be limited to about 10 nm, and the height 16H of the fin 16 may need to be about 24 nm or so to provide sufficient drive current and insure high drive current densities. With the thickness 17T of the cladding material 17 being about 3 nm (or 4 nm), that means that the fin 16 will have to be initially manufactured to a thickness 16T of about 4 nm (or 2 nm) to maintain the overall target width 19 of about 10 nm. Manufacturing such a relatively tall and slender fin 16 is very difficult to do using the process flow described above. One possible solution that might help to alleviate this problem would be to decrease the thickness 17T of the cladding material 17, but that would increase the resistance in the channel region and be counter-productive to the primary purpose of forming the channel cladding material 17 in the first place.

The present disclosure is directed to various methods of forming a channel region for a semiconductor device by performing a triple cladding process, and the resulting semiconductor device, that may reduce or eliminate one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a channel region for a semiconductor device by performing a triple cladding process, and the resulting semiconductor device. One illustrative method disclosed herein includes, among other things, forming a plurality of trenches in a semiconductor substrate so as to define a fin, performing a plurality of epitaxial deposition processes to form first, second and third layers of epi semiconductor material around an exposed portion of the fin, performing at least one process operation to remove the first, second and third layers of epi semiconductor material from above an upper surface of the fin so as to thereby expose the fin, performing an etching process to selectively remove the fin relative to the first, second and third layers of epi semiconductor material so as to thereby define two fin structures comprised of the first, second and third layers of epi semiconductor material, and forming a gate structure around a portion of at least one of the fin structures comprised of the first, second and third layers of epi semiconductor material.

Another illustrative method disclosed herein involves, among other things, forming a plurality of trenches in a semiconductor substrate so as to define a fin, performing a first epitaxial deposition process to form a first layer of epi semiconductor material on an exposed portion of the fin, performing a second epitaxial deposition process to form a second layer of epi semiconductor material on the first layer of epi semiconductor material, performing a third epitaxial deposition process to form a third layer of epi semiconductor material on the second layer of epi semiconductor material, overfilling the trenches with a layer of insulating material, performing at least one planarization process to remove at least the first, second and third layers of epi semiconductor material from above an upper surface of the fin so as to thereby expose the fin, performing an etching process to selectively remove the fin relative to the first, second and third layers of epi semiconductor material so as to thereby define two fin structures comprised of the first, second and third layers of epi semiconductor material, and forming a gate structure around a portion of at least one of the fin structures comprised of the first, second and third layers of epi semiconductor material.

One illustrative device disclosed herein includes, among other things, a substrate made of a first semiconductor material, at least one layer of insulating material positioned above the substrate, a fin structure positioned above the layer of insulating material and the substrate, the fin structure comprising first, second and third layers of semiconductor material, wherein the semiconductor materials of the first, second and third layers are different than the first semiconductor material, and a gate structure around a portion of the fin structure comprised of the first, second and third layers of semiconductor material.

BRIEF DESCRIPTION OF THE DRAWINGS

The disclosure may be understood by reference to the following description taken in conjunction with the accompanying drawings, in which like reference numerals identify like elements, and in which.

Figure 1A:
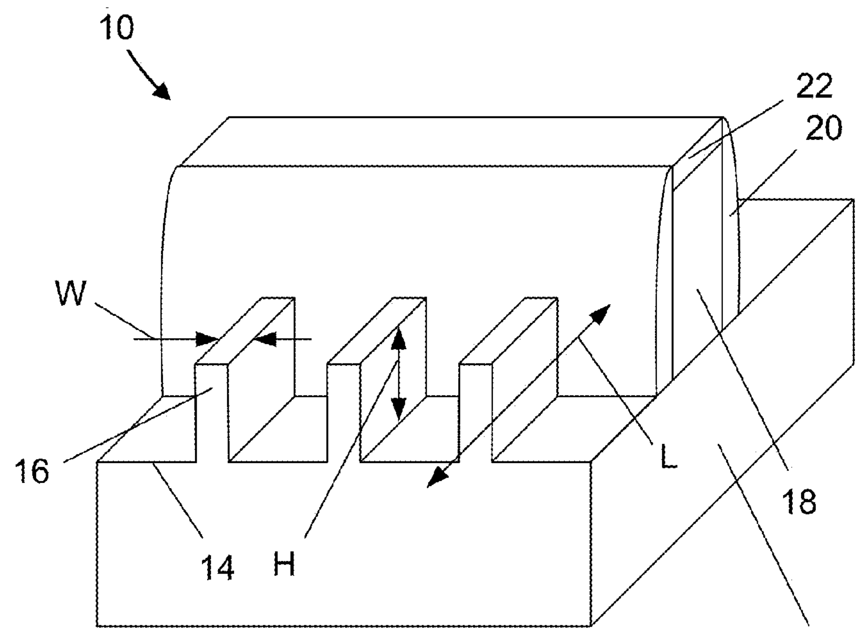
FIG. 1A is a perspective view of one illustrative embodiment of a prior art FinFET device.
Figure 1B:
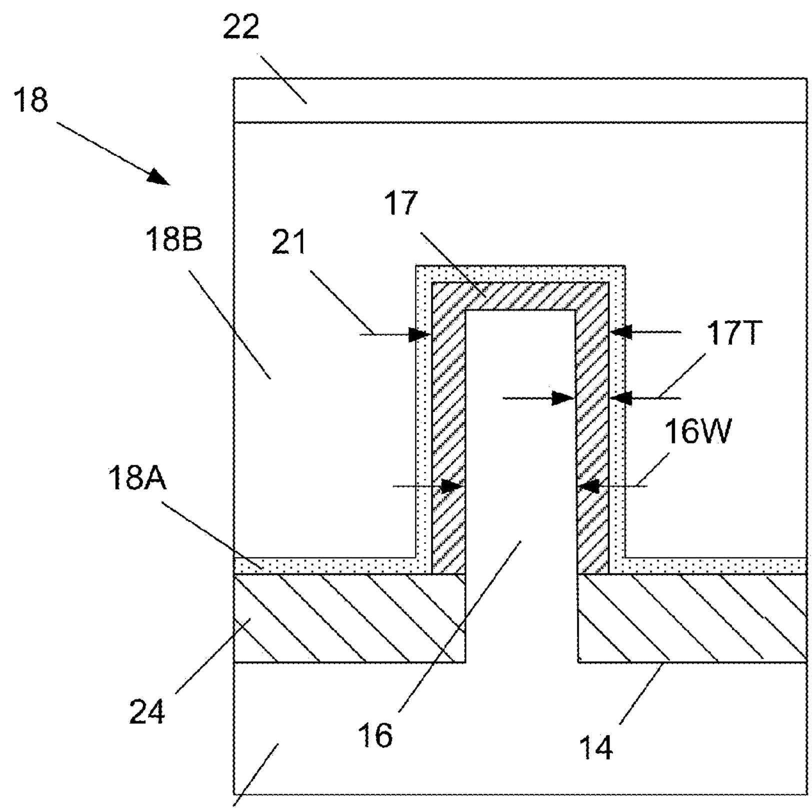
FIGS. 1B-1C are cross-sectional views of a fin structure of a prior art FinFET device.
Figure 1C:
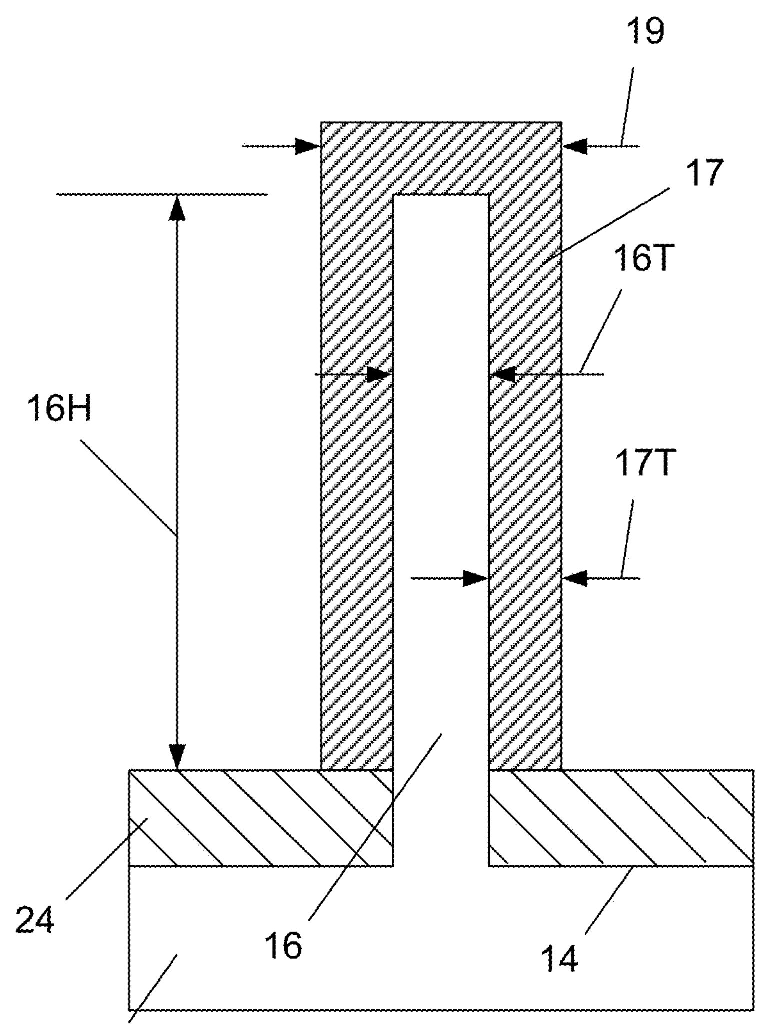

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming a channel region for a semiconductor device by performing a triple cladding process, and the resulting semiconductor device. As will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. With reference to the attached figures, various illustrative embodiments of the methods and devices disclosed herein will now be described in more detail.

In one embodiment, the illustrative device 100 will be formed in and above the semiconductor substrate 102, having a bulk configuration. The device 100 may be either an NMOS or a PMOS transistor. The gate structure of the device 100 may be formed using either so-called "gate-first" or "replacement gate" ("gate-last") techniques. The substrate 102 may be made of silicon or it may be made of materials other than silicon. Thus, the terms "substrate" or "semiconductor substrate" should be understood to cover all semiconducting materials and all forms of such materials. Additionally, various doped regions, e.g., source/drain regions, halo implant regions, well regions and the like, are not depicted in the attached drawings. Of course, the inventions disclosed herein should not be considered to be limited to the illustrative examples depicted and described herein. The various components and structures of the device 100 disclosed herein may be formed using a variety of different materials and by performing a variety of known techniques, e.g., a chemical vapor deposition (CVD) process, an atomic layer deposition (ALD) process, a thermal growth process, epi growth processes, spin-coating techniques, etc. The thicknesses of these various layers of material may also vary depending upon the particular application.

Figure 2A:
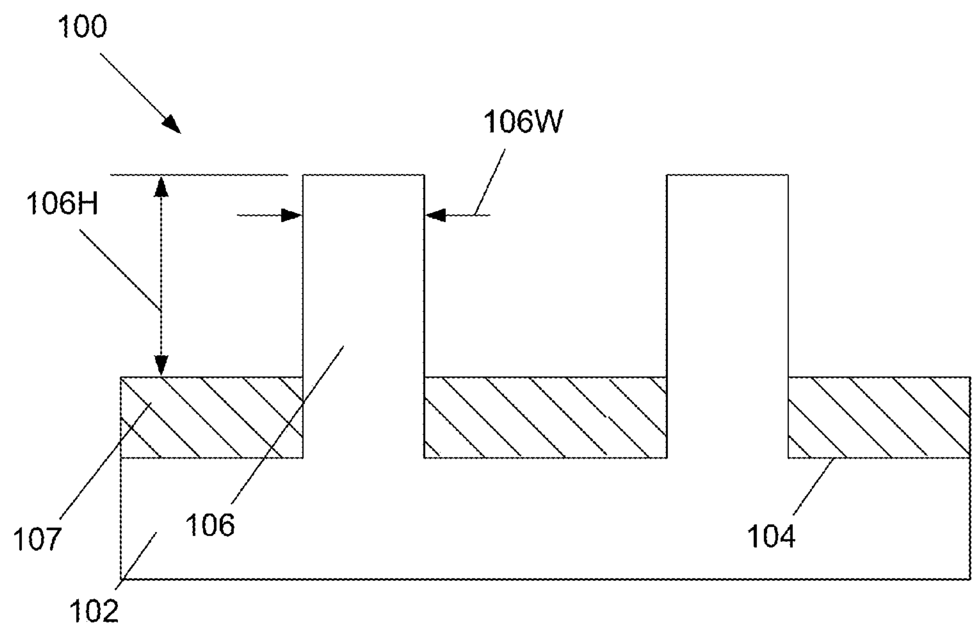
FIGS. 2A-2ZA depict various illustrative methods disclosed herein of forming a channel region of a semiconductor device by performing a triple cladding process, and the resulting semiconductor device.

FIG. 2A depicts the device 100 after several process operations were performed. First, one or more etching processes, e.g., anisotropic etching processes, were performed through a patterned etch mask (not shown), such as a patterned hard mask layer, to define a plurality of fin-formation trenches 104 in the substrate 102. The formation of the trenches 104 results in the formation of a plurality of initial fin structures 106. Thereafter, a recessed layer of insulating material 107, such as a layer of silicon dioxide, was formed in the trenches 104 between the fins 106. In one illustrative embodiment, the recessed layer of insulating material 107 may be formed by blanket depositing the initial layer of insulating material across the device so as to over-fill the trenches 104. Thereafter, an optional chemical mechanical polishing (CMP) process may be performed to planarize the upper surface of the layer of material 107. Then, a timed, recessing etch-back process may be performed on the layer of insulating material 107 to recess the upper surface of the layer of insulating material 107 to the desired height level, thereby exposing a desired amount of the fins 106 above the recessed surface. The layer of material 107 may be comprised of a variety of different materials, such as silicon dioxide, SiON, SiN, etc., and it may be formed by performing a variety of techniques, e.g., chemical vapor deposition (CVD), etc.

The overall size, shape and configuration of the fin-formation trenches 104 and fins 106 may vary depending on the particular application. In the illustrative examples depicted in the attached drawings, the fin-formation trenches 104 and fins 106 are all depicted as having a uniform size and shape. However, such uniformity in the size and shape of the fin-formation trenches 104 and the fins 106 is not required to practice at least some aspects of the inventions disclosed herein. In the attached figures, the fin-formation trenches 104 are depicted as having been formed by performing an anisotropic etching process that results in the fin-formation trenches 104 having a schematically depicted, generally rectangular configuration. In an actual real-world device, the sidewalls of the fin-formation trenches 104 may be somewhat inwardly tapered, although that configuration is not depicted in the attached drawings. In some cases, the fin-formation trenches 104 may have a reentrant profile (not shown) near the bottom of the fin-formation trenches 104. To the extent the fin-formation trenches 104 are formed by performing a wet etching process, the fin-formation trenches 104 may tend to have a more rounded configuration or non-linear configuration as compared to the generally rectangular configuration of the fin-formation trenches 104 that are formed by performing an anisotropic etching process. Thus, the size and configuration of the fin-formation trenches 104, and the manner in which they are made, as well as the general configuration of the fins 106, should not be considered a limitation of the present invention. For ease of disclosure, only the substantially rectangular fin-formation trenches 104 and fins 106 will be depicted in the subsequent drawings. Moreover, the device 100 may be formed with any desired number of fins 106.

The width and height of the fin structures 106 as well as the depth of the trenches 104 may vary depending upon the particular application. As will be appreciated by those skilled in the art after a complete reading of the present application, using the methods disclosed herein, the fins 106 may be formed to a width 106W, e.g., about 30 nm, that can be readily manufactured using existing tools and techniques. Additionally, the device 100 may be formed such that the exposed height 106H of the fins 106 may be set at virtually any desired value, e.g., 24 nm or in the range from about 20 nm up to 40 nm.

Figure 2B:
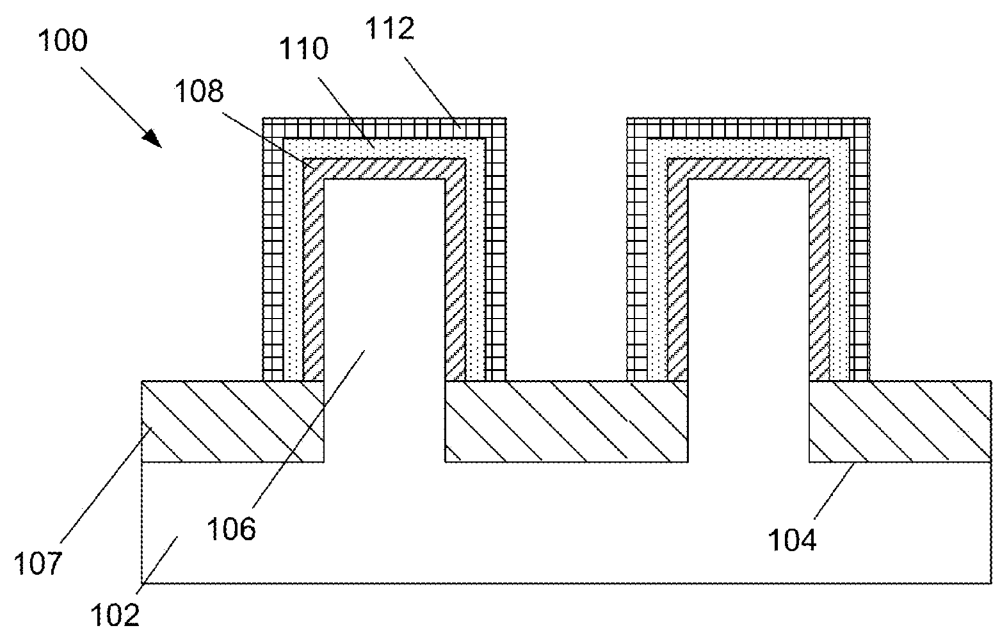

FIG. 2B depicts the device 100 after three layers of semiconductor cladding material 108, 110 and 112 (these layers may be collectively referred to as the "cladding layers") were sequentially formed around the fins 106 by performing known epitaxial deposition processes. The thickness and materials of construction of the cladding layers 108, 110 and 112 may vary depending upon the particular application. The cladding layers need not all be made of the same thickness, although such a situation may occur. For example, in one embodiment, all of the cladding layers may have the same thickness of about 2-4 nm. In general, as will be described more fully below, the cladding layers 108, 110, 112 should be made of a material such that the material of the fin 106, i.e., the substrate 102, may be selectively removed (by etching) relative to the cladding layers. In one illustrative embodiment, the layers 108 and 112 may be made of the same semiconductor material, and these layers may be made of materials that are specifically tailored for N-type or P-type devices. In another embodiment, the three cladding layers 108, 110, 112 may all be made of the same semiconductor material, e.g., silicon germanium, with the layer 110 (the middle layer or core) having a lower germanium concentration than that of the silicon germanium material used for the layers 108 and 112. As one particular example, for a PMOS device, the layer 110 may be made of silicon germanium where the typical concentration of germanium may vary between about 10-35%, e.g., $SiGe_{0.25}$, while the layers 108 and 112 may be made of silicon germanium where the typical concentration of germanium may vary between about 40-80%, e.g., $SiGe_{0.45}$. For an NMOS device, the layers may be made of silicon, a silicon germanium material having a germanium concentration of 10% or less, or they may be made of III-V compound semiconductor materials, such as InAs, InGaAs, InGaSb, etc. If desired, various materials, such as carbon for group IV semiconductor materials, may be incorporated into the cladding layers as they are being formed. In one illustrative embodiment, the cladding layers 108, 110, 112 may be a III-V material, InGaAs, GaAs, InAs, GaSb, InSbAs, SiGe, etc.

Figure 2C:
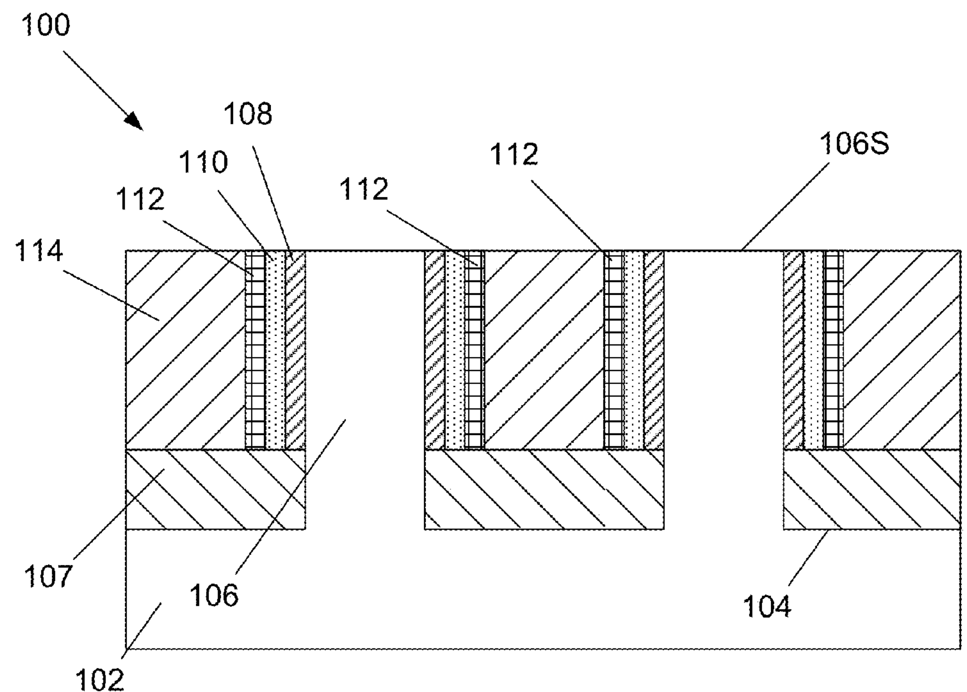

FIG. 2C depicts the device 100 after several process operations were performed. First, another layer of insulating material 114 was formed on the device 100 so as to overfill the spaces or trenches between the cladding layers 112. The layer of insulating material 114 may be comprised of a variety of different materials, such as, for example, silicon dioxide, silicon nitride, silicon oxynitride or any other dielectric material in common use in the semiconductor manufacturing industry, etc., or multiple layers thereof, etc., and it may be formed by performing a variety of techniques, e.g., CVD, ALD, etc. The layer of insulating material 114 may be comprised of the same material as that of the layer of insulating material 107, or it may be comprised of a different material. Next, one or more planarization processes, such as a chemical mechanical polishing (CMP) process or dry vertical etching process, were performed to planarize the upper surface of the layer of insulating material 114 and remove the portions of the cladding layers 108, 110, 112 positioned above the upper surface 106S of the fins 106. Such process operations expose the upper surface 106S of the fins 106 for further processing.

As will be appreciated by those skilled in the art after a complete reading of the present application, the structure depicted in FIG. 2C may be arrived at by performing a variety of different process flows. For example, as depicted, all three of the cladding layers may be initially formed (FIG. 2B) followed by depositing the layer of insulating material 114 and performing one or more planarization processes, e.g., CMP processes. Alternatively, as shown in FIGS. 2H-2K, the first cladding layer 108 may be formed (FIG. 2H), the layer of insulating material 114 may be deposited and a planarization process may be performed to expose the upper surface 106S of the fins 106 (FIG. 2I), the layer of insulating material 114 may be removed and the cladding materials 110, 112 may be formed (FIG. 2J), and another layer of insulating material 135 may be deposited and another planarization process may be performed to expose the upper surface of the fins 106 (FIG. 2K). Another alternative process flow is depicted in FIGS. 2L-2Q. More specifically, the first cladding layer 108 may be formed (FIG. 2L), the layer of insulating material 114 may be deposited and a planarization process may be performed to expose the upper surface 106S of the fins 106 (FIG. 2M), the layer of insulating material 114 may be removed and the cladding material 110 may be formed (FIG. 2N), another layer of insulating material 137 may be deposited and another planarization process may be performed to expose the upper surface of the fins 106 (FIG. 2O), the layer of insulating material 137 may be removed and the cladding material 112 may be formed (FIG. 2P), and another layer of insulating material 139 may be deposited and another planarization process may be performed to expose the upper surface of the fins 106 (FIG. 2Q). Yet another alternative process flow is depicted in FIGS. 2R-2U. More specifically, the first and second cladding layers 108, 110 may be formed (FIG. 2R), the layer of insulating material 114 may be deposited and a planarization process may be performed to expose the upper surface 106S of the fins 106 (FIG. 2S), the layer of insulating material 114 may be removed and the cladding material 112 may be formed (FIG. 2T), and another layer of insulating material 141 may be deposited and another planarization process may be performed to expose the upper surface of the fins 106 (FIG. 2U).

Figure 2D:
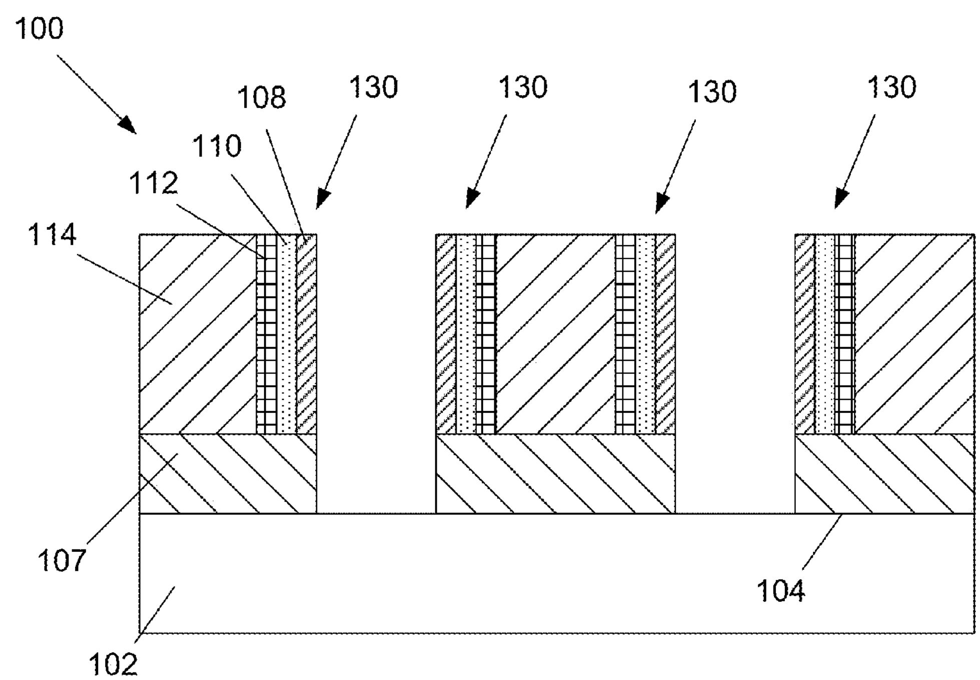

Returning to the originally discussed process flow, FIG. 2D depicts the device 100 after an etching process, such as a timed wet etching process, was performed to selectively remove the fins 106 relative to the surrounding structures and layers, and, in particular, relative to the cladding layers 108, 110, 112 and the insulating material layers 114 and 107. For each fin removed, the process effectively defines two triple-cladding fin structures 130 comprised of the substantially vertically oriented semiconductor material layers 108, 110 and 112 (relative to the substrate). Four such fin structures 130 are depicted in FIG. 2D.

Figure 2E:
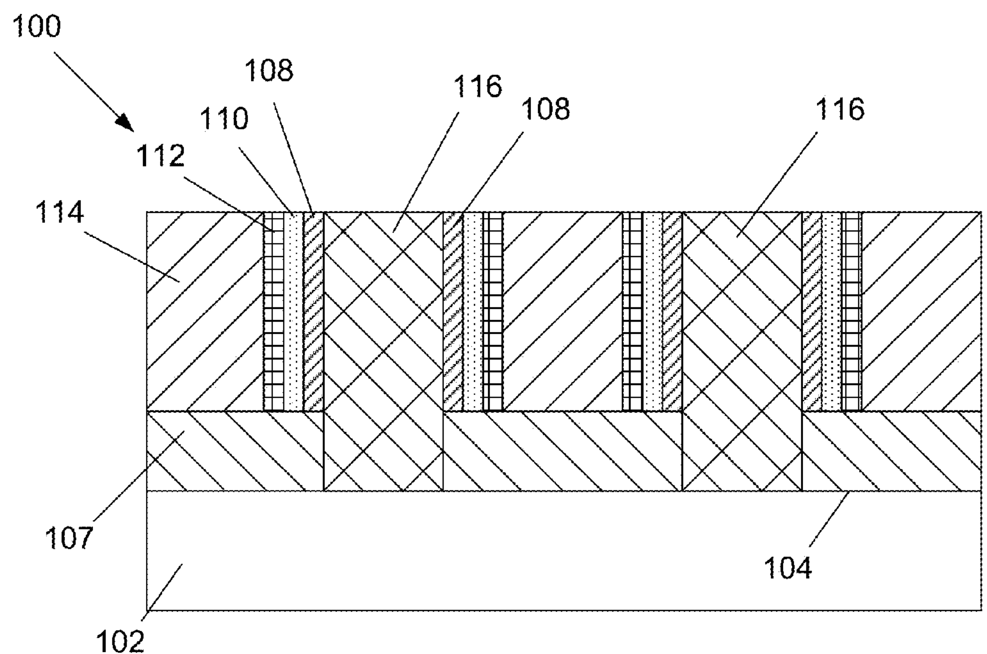

FIG. 2E depicts the device 100 after several process operations were performed. First, another layer of insulating material 116 was formed on the device 100 so as to overfill the spaces or trenches between the semiconductor materials 108. The layer of insulating material 116 may be comprised of a variety of different materials, such as, for example, silicon dioxide, silicon nitride, silicon oxynitride or any other dielectric material in common use in the semiconductor manufacturing industry, etc., or multiple layers thereof, etc., and it may be formed by performing a variety of techniques, e.g., CVD, ALD, etc. The layer of insulating material 116 may be comprised of the same material as that of the layers of insulating material 107, 114, or it may be comprised of a different material. Next, one or more planarization processes, such as chemical mechanical polishing (CMP) processes, were performed to planarize the upper surface of the layers of insulating material 114, 116.

Figure 2F:
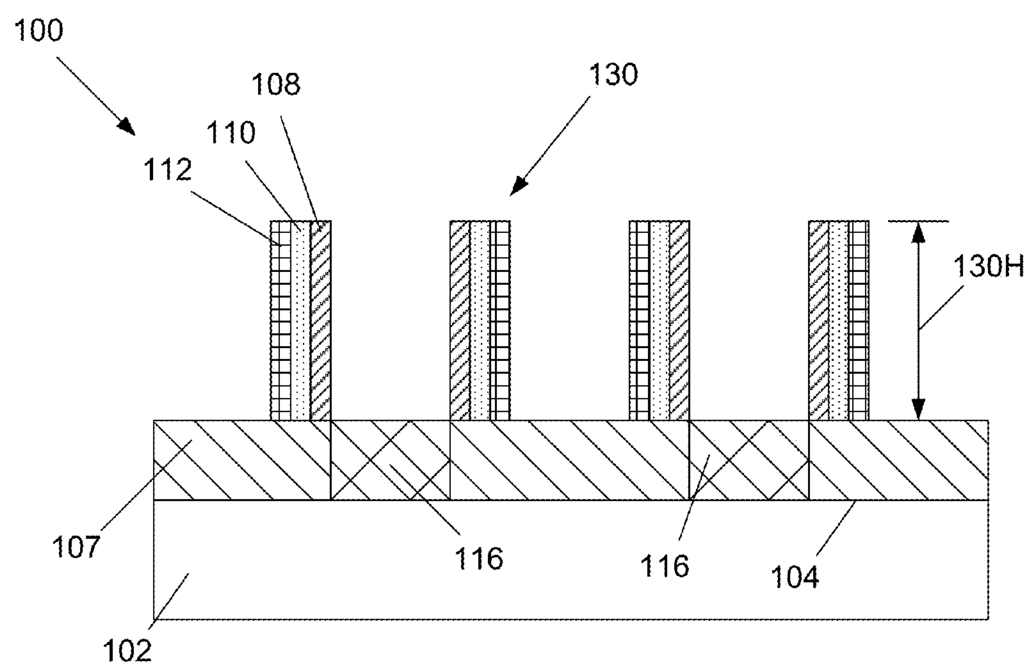

FIG. 2F depicts the device 100 after one or more recess etching processes were performed to selectively remove at least some, and perhaps all, of the layers of insulating materials 114, 116 relative to the surrounding structures. These process operations expose the desired final height 130H of the triple-cladding fin structures 130 disclosed herein. As will be appreciated by those skilled in the art after a complete reading of the present application, in the final device, the vast majority of the current will flow in the outer semiconductor layers 108, 112, while the cladding layer 110 will serve as the core or barrier between the two layers 108, 112.

Figure 2G:
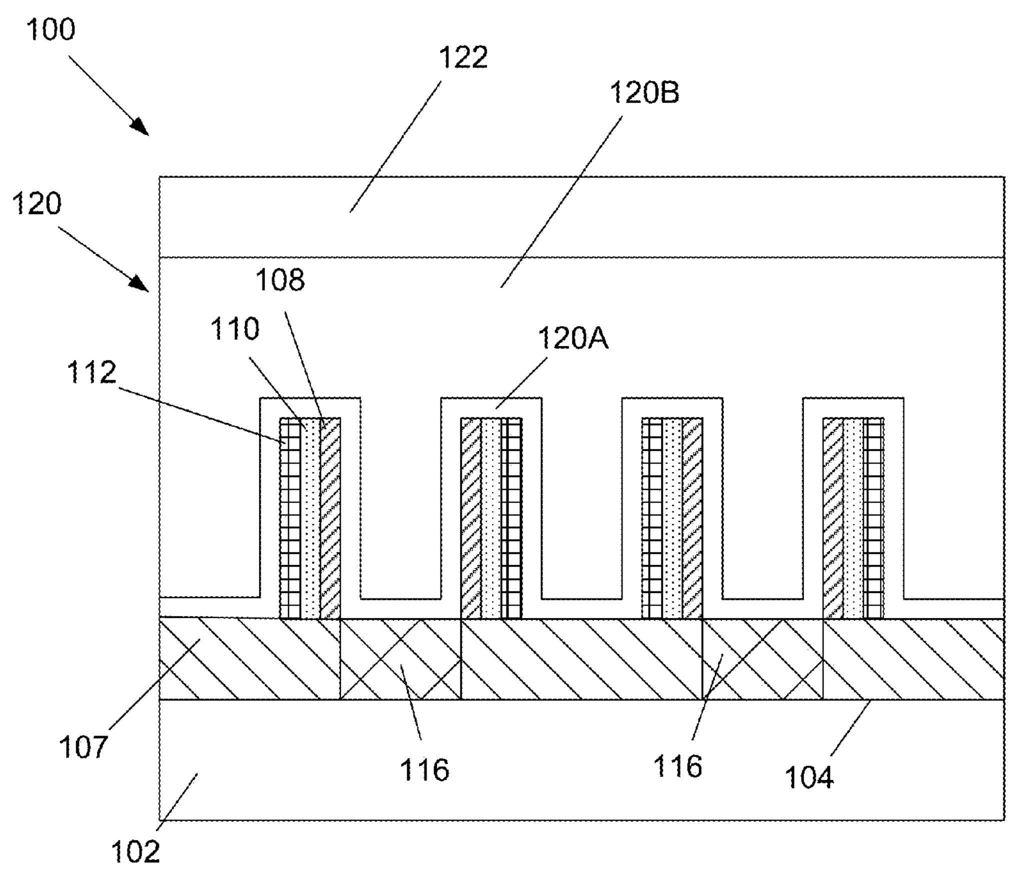
Figure 2H:
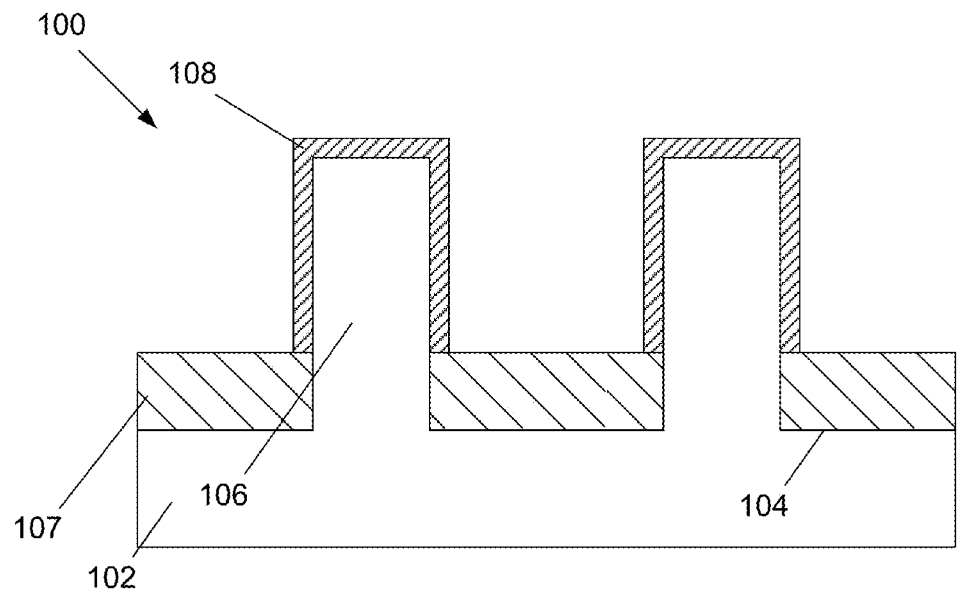
Figure 2I:
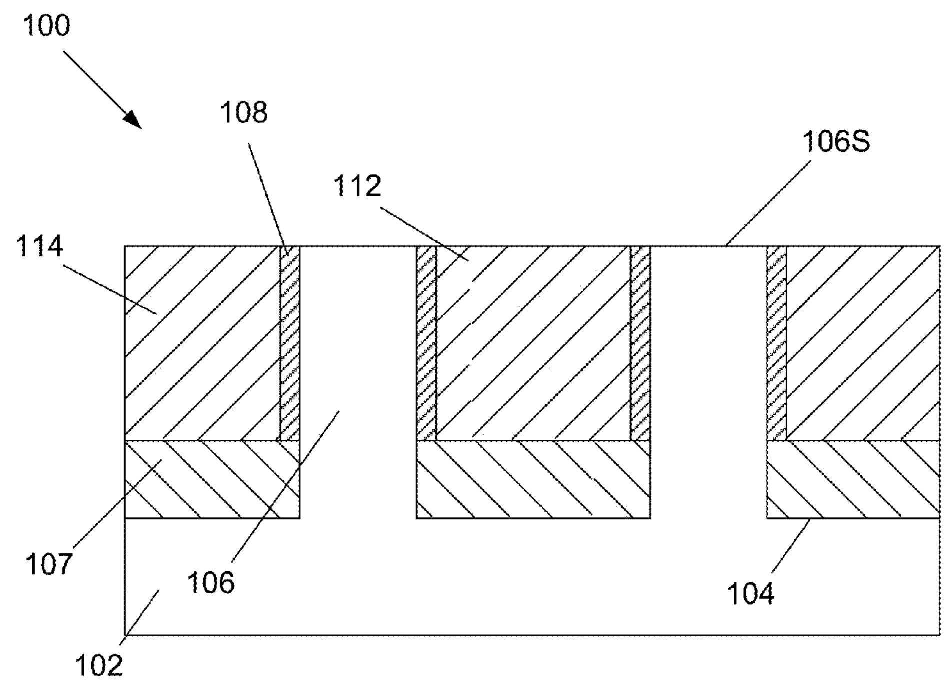
Figure 2J:
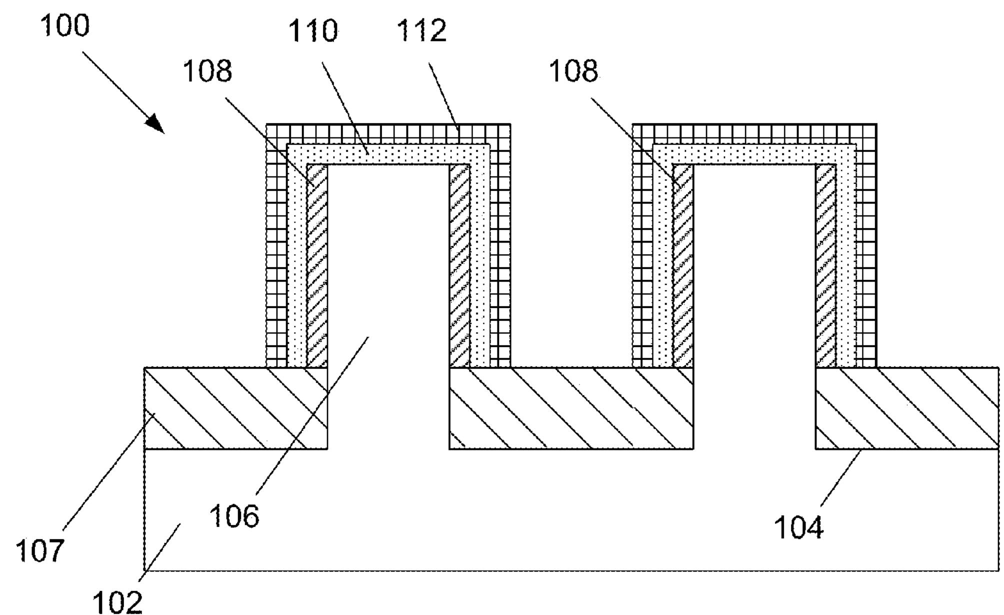
Figure 2K:
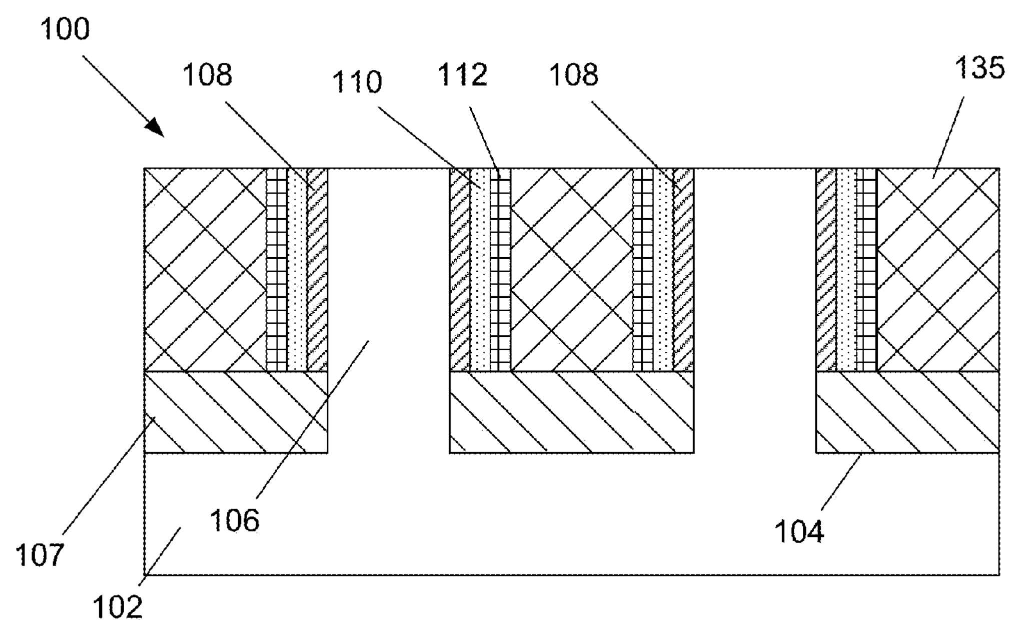
Figure 2L:
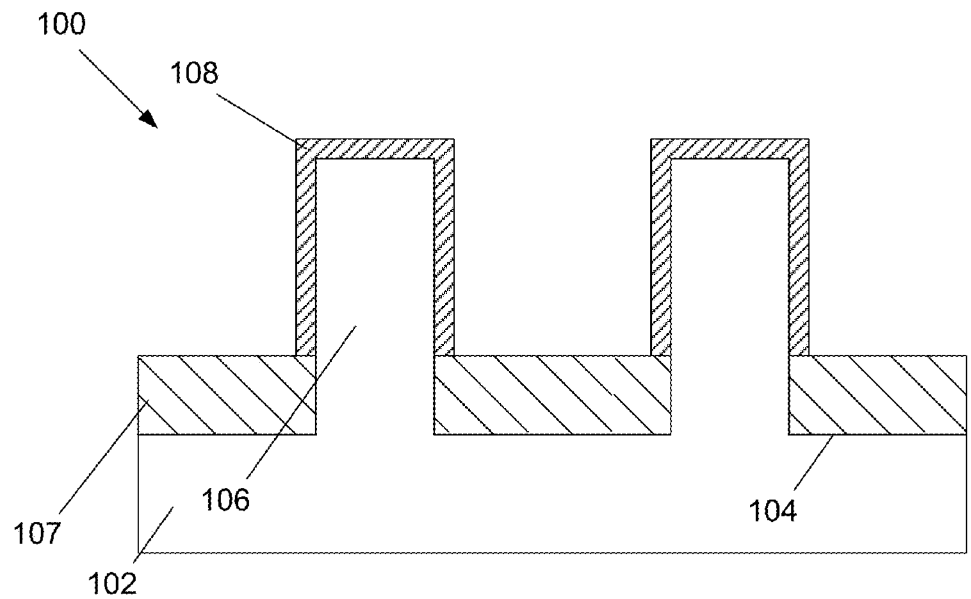
Figure 2M:
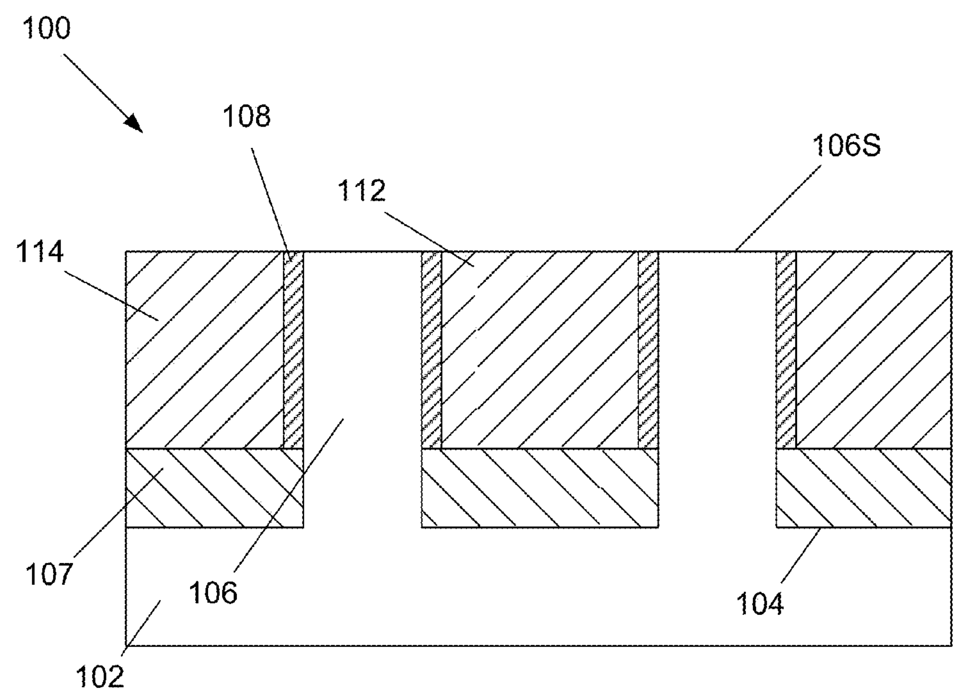
Figure 2N:
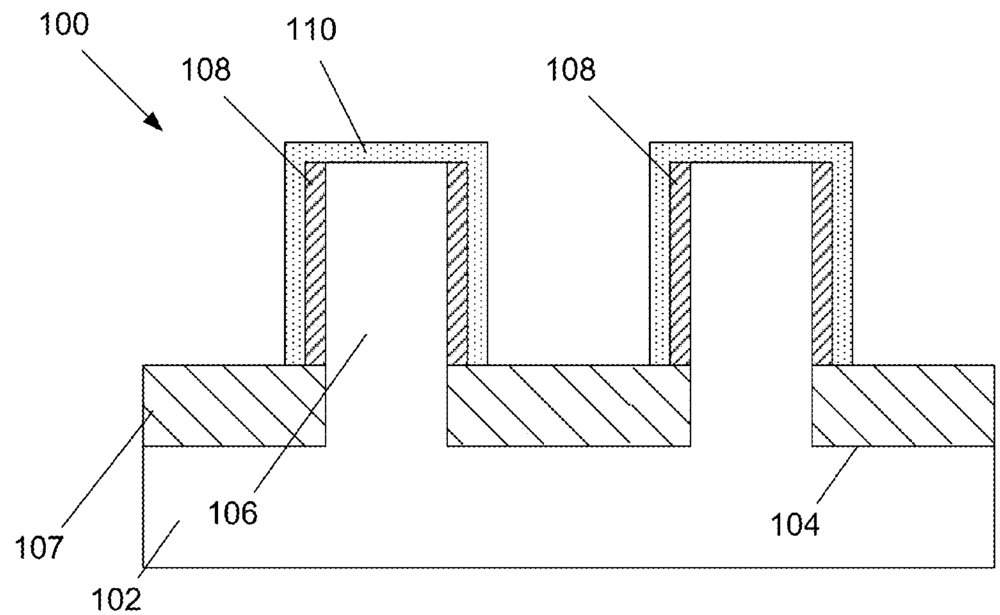
Figure 2O:
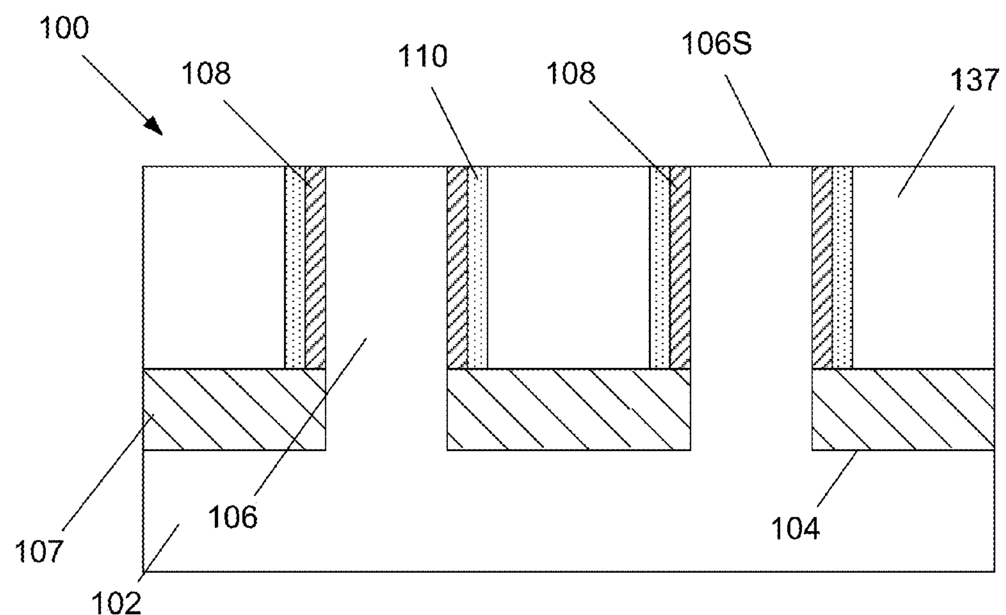
Figure 2P:
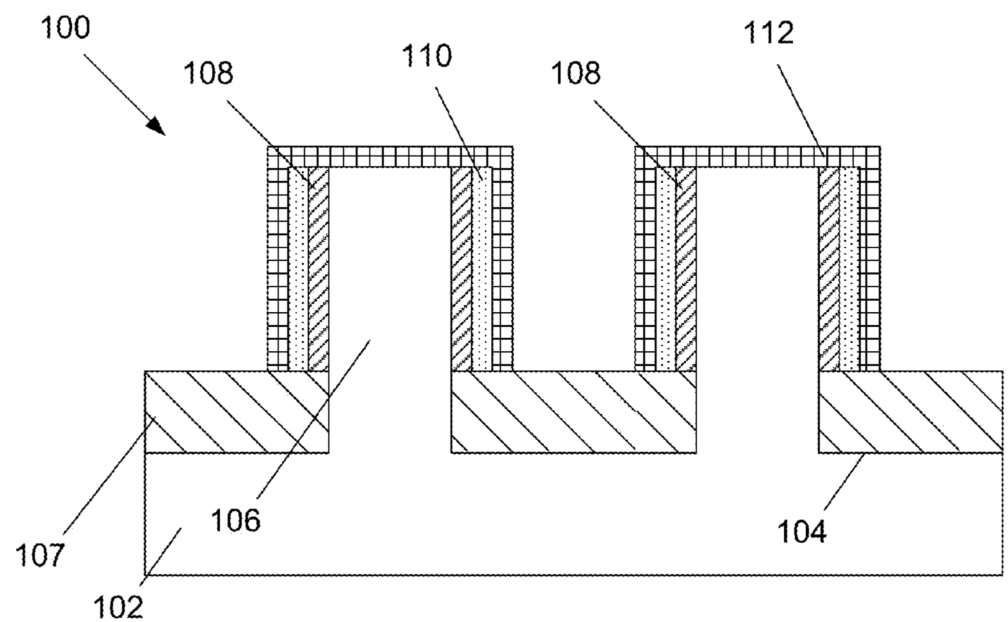
Figure 2Q:
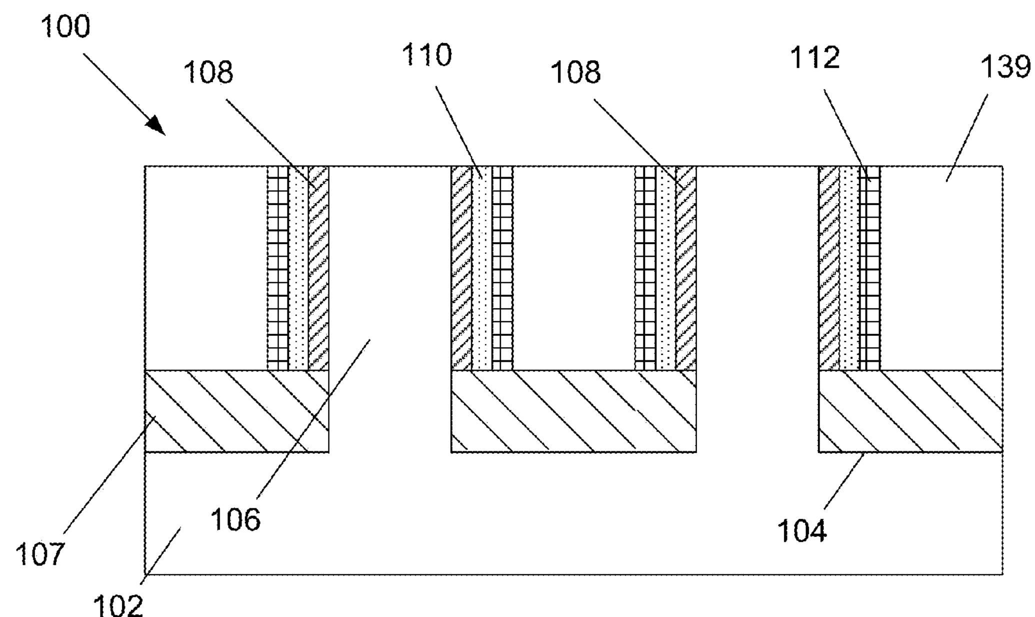
Figure 2R:
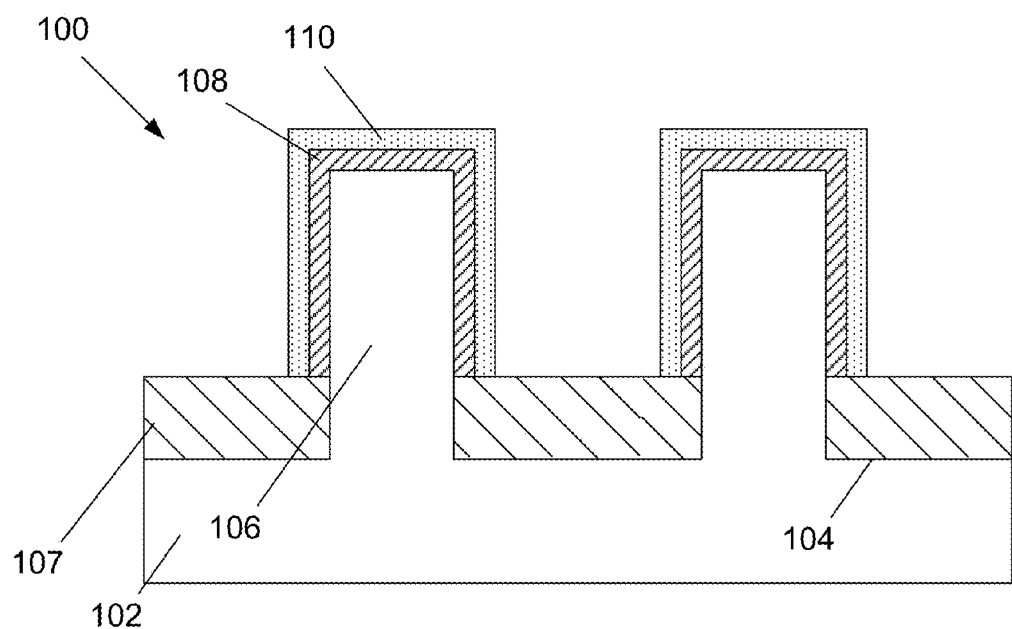
Figure 2S:
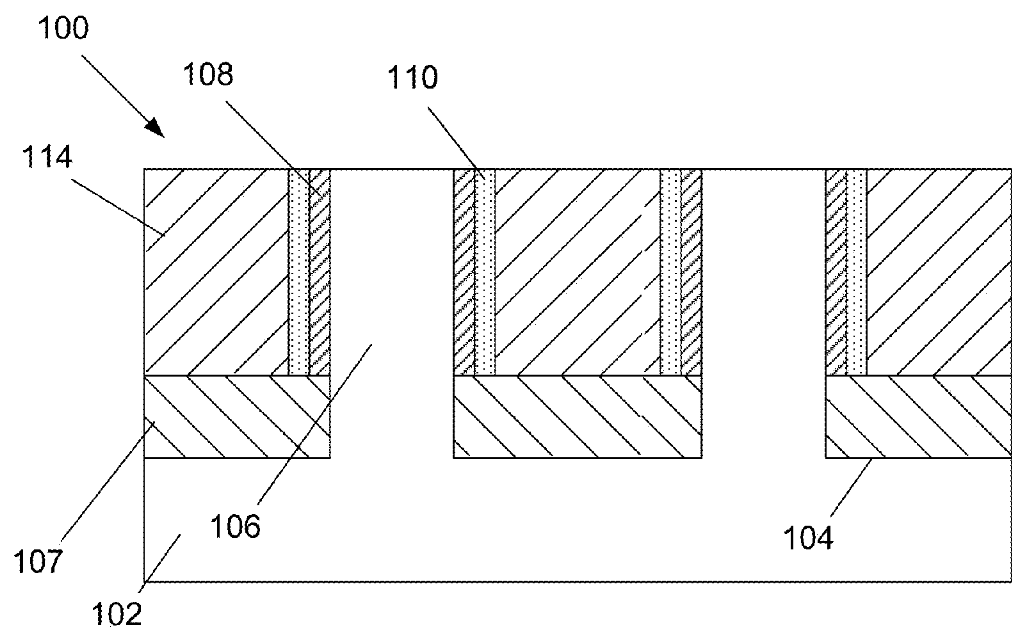
Figure 2T:
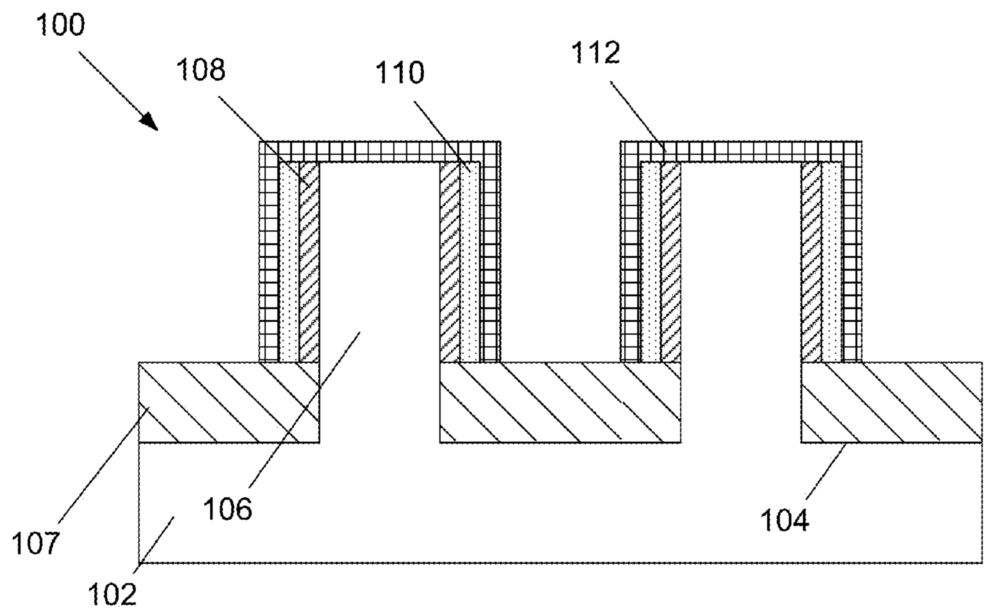
Figure 2U:
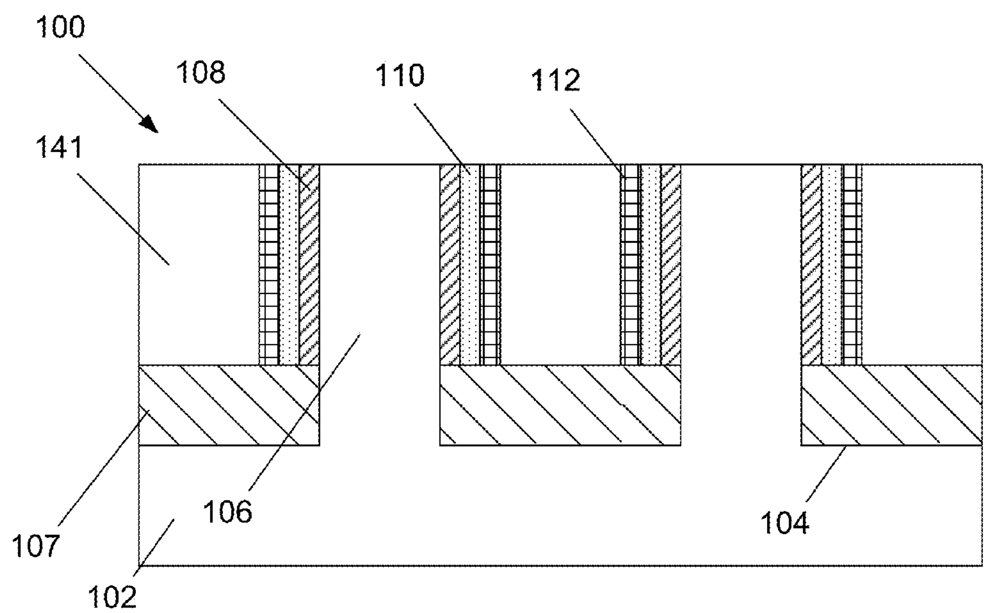

Next, as shown in FIG. 2G, an illustrative gate structure 120 is formed on the device 100 using well-known techniques. i.e., gate-first or gate-last techniques. In one illustrative embodiment, the schematically depicted gate structure 120 includes an illustrative gate insulation layer 120A and an illustrative gate electrode 120B. An illustrative gate cap layer 122 may also be formed above the gate electrode 120B. The gate insulation layer 120A may be comprised of a variety of different materials, such as, for example, silicon dioxide, a so-called high-k (k value greater than 10) insulation material (where k is the relative dielectric constant), etc. The thickness of the gate insulation layer 120A may also vary depending upon the particular application, e.g., it may have a physical thickness of about 1-2 nm. Similarly, the gate electrode 120B may also be of a variety of conductive materials, such as polysilicon or amorphous silicon, a metal compound, or it may be comprised of one or more metal layers that act as the gate electrode 120B. As will be recognized by those skilled in the art after a complete reading of the present application, the gate structure 120 of the device 100 depicted in the drawings, i.e., the gate insulation layer 120A and the gate electrode 120B, is intended to be representative in nature. That is, the gate structure 120 may be comprised of a variety of different materials and it may have a variety of configurations.

As noted above, the layers 108 and 112 will define the primary channel regions of the device (also sometimes referred to as surface channel regions), where substantially all of the current will flow during operation of the device 100, while the layer 110 will act as a core region wherein little if any of the current will flow when the device 100 is in operation.

At this point, traditional manufacturing techniques may be performed to complete the manufacture of the device 100. For example, a sidewall spacer (not shown) comprised of, for example, silicon nitride, may be formed adjacent the gate structure 120. After the spacer is formed, if desired, an epitaxial growth process may be performed to form additional semiconducting material (not shown) in the source/drain regions of the device. Additional contacts and metallization layers may then be formed above the device 100 using traditional techniques.

As is well known to those skilled in the art, silicon germanium is a candidate for alternative material for the channel region of a PMOS device due to the superior hole mobility as compared to silicon. However, the inventors have discovered that, quite surprisingly, forming a P-type FinFET device with the channel semiconductor materials (the layers 108 and 112) being made of silicon germanium having a thickness of less than 5 nm and the core layer 110 being made of silicon or SiGe (with a low Ge concentration) leads to significantly improved device performance. More specifically, reducing the <110> SiGe channel (<110> being the direction of current flow in the SiGe channel material) to a thickness below 5 nm has a clear and surprising positive impact of improving the ballistic ON current of the device as well as increasing the band gap of the SiGe channel material. While not attempting to limit the scope of the inventions disclosed herein, both effects are believed to be attributable to the change in the band structure due to quantum confinement of the SiGe channel material.

Figure 2V:
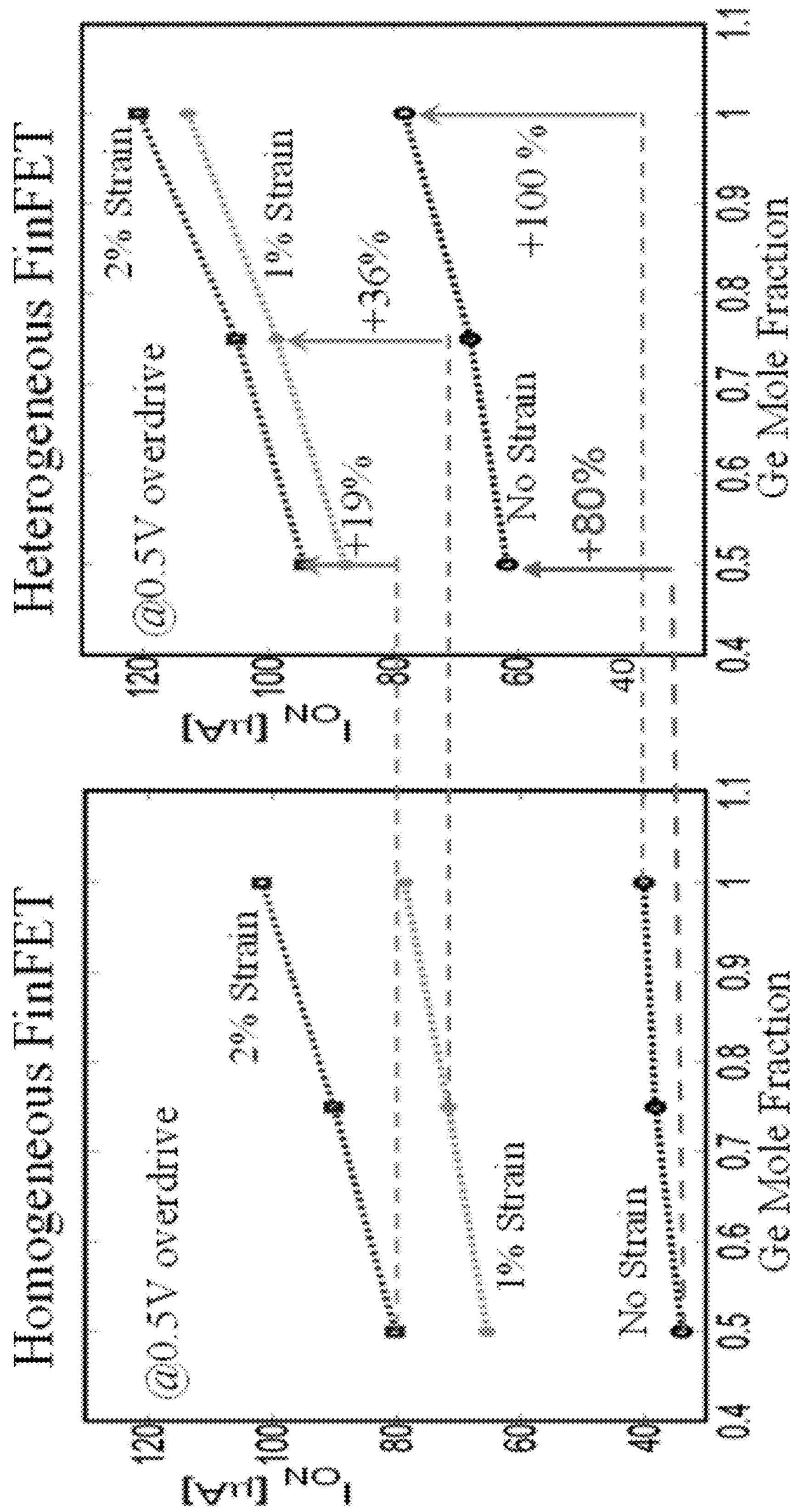
Figures 2W, 2X:
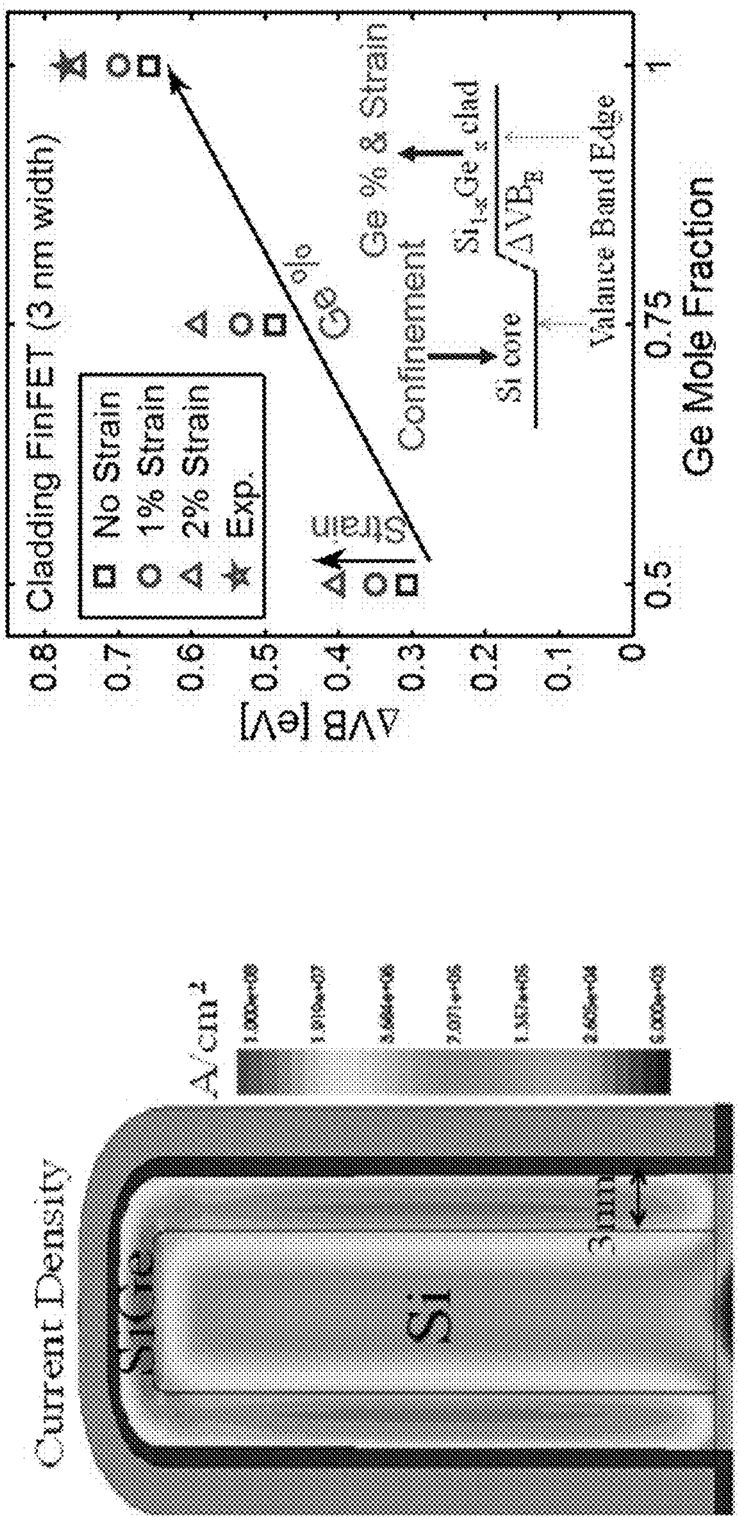
Figures 2Y, 2Z:
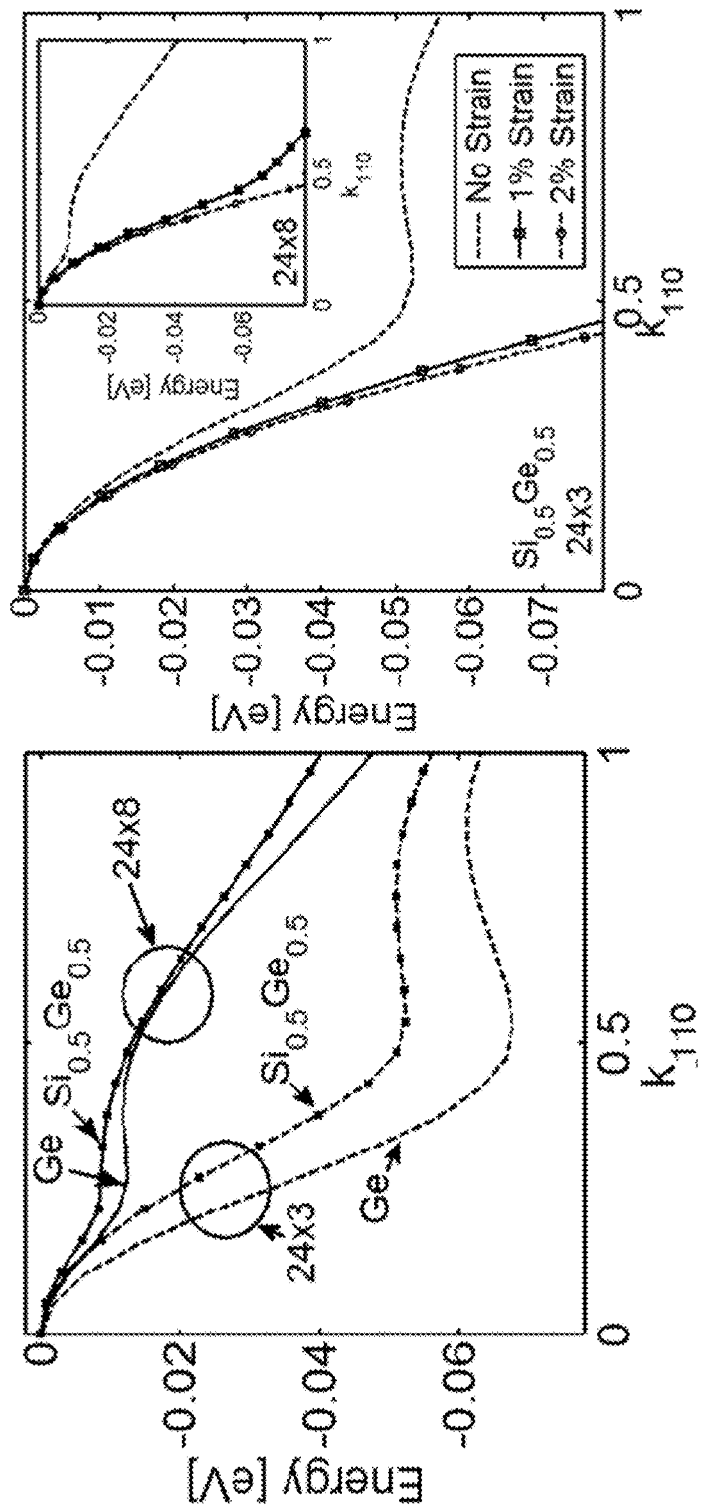
Figure 2Z:
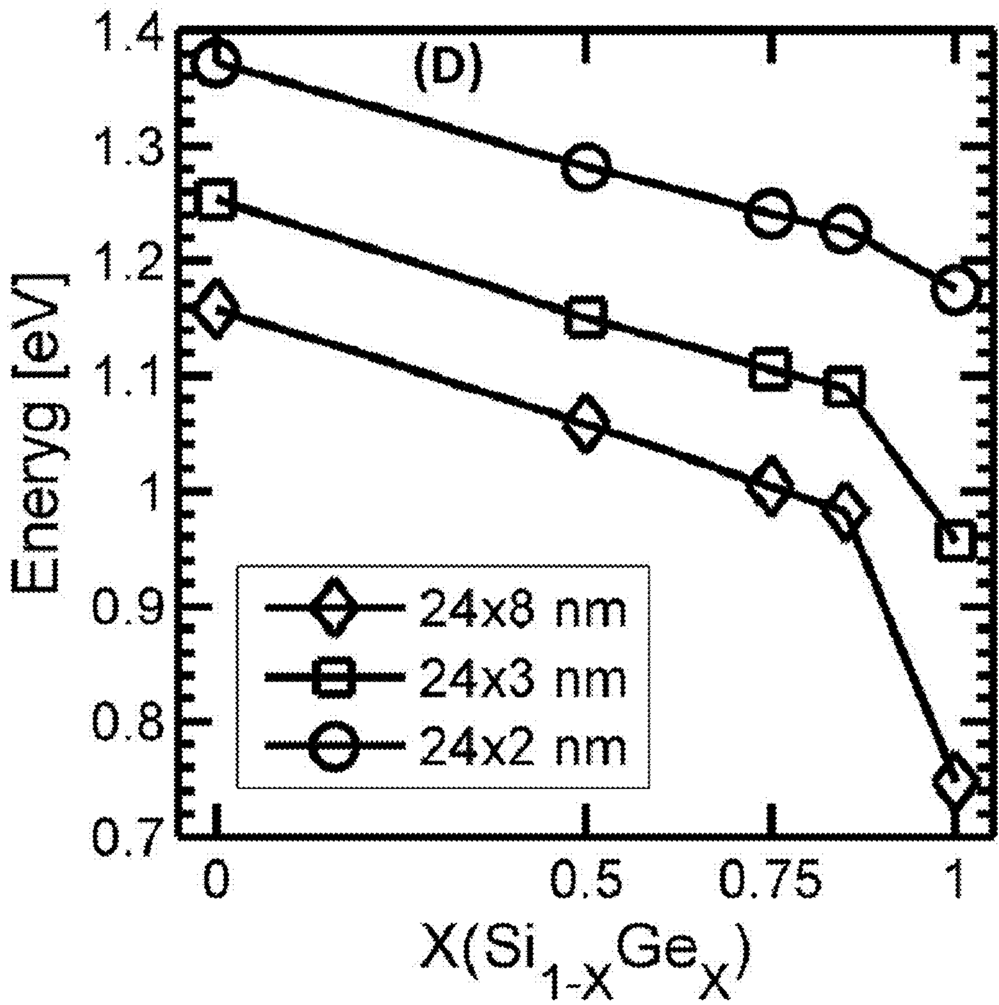

FIG. 2V depicts a comparison of a FinFET device having the structure depicted herein (Heterogeneous FinFET) wherein the channel cladding materials 108, 112 were made of SiGe and had a thickness of 3 nm and the core cladding material 110 (in this specific example) was made of silicon and had a thickness of 2 nm, and that of a FinFET device with homogenous SiGe channel material with a thickness of 8 nm (Homogeneous FinFET). Sentaurus TCAD was used for device and process simulations. NEMOS was used for band structure and ballistic transport simulations. In general, three main results are shown. First, in the Heterogeneous FinFET device disclosed herein, the carriers for current transport stay confined in the SiGe channel cladding regions (108, 112), as depicted in FIG. 2W, because there is enough band edge offset (see FIG. 2X) between the channel cladding layers (108, 112) and the adjacent materials, e.g., the core material 110. Second, quantum confinement increases the curvature of energy bands for transport as the channel cladding layer (108, 112) thickness is reduced from 8 nm (FIG. 2Y) to 3 nm (FIG. 2Z). Lastly, reducing the channel cladding layer thickness from 8 nm to 3 nm significantly increases the band gap, as depicted in FIG. 2ZA. This is important because band gap is an important parameter that controls the leakage current in the off state of the device.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:

forming a plurality of trenches in a semiconductor substrate so as to define a fin;

performing a plurality of epitaxial deposition processes to form first, second and third layers of epi semiconductor material around an exposed portion of said fin;

performing at least one process operation to remove said first, second and third layers of epi semiconductor material from above an upper surface of said fin so as to thereby expose said fin;

performing an etching process to selectively remove said fin relative to said first, second and third layers of epi semiconductor material so as to thereby define two fin structures comprised of said first, second and third layers of epi semiconductor material; and forming a gate structure around a portion of at least one of said fin structures comprised of said first, second and third layers of epi semiconductor material.

2. The method of claim 1, wherein said first and third layers of epi semiconductor material are made of the same semiconductor material.

3. The method of claim 1, wherein said first, second and third layers of epi semiconductor material are all silicon germanium material and wherein the germanium concentration in said first and third layers of epi semiconductor material is substantially the same and the germanium concentration in said second layer of epi semiconductor material is less than said germanium concentration in each of said first and third layers of epi semiconductor material.

4. The method of claim 1, wherein said first and third layers of epi semiconductor material are made of $SiGe_{0.45}$ and said second layer of epi semiconductor material is made of $SiGe_{0.25}$.

5. The method of claim 1, wherein said first and third layers of epi semiconductor material are each made of silicon, a silicon germanium material having a germanium concentration of 10% or less or a group III-V material.

6. The method of claim 1, wherein said first and third layers of epi semiconductor material are made of silicon germanium and they have a thickness of less than 5 nm.

7. The method of claim 1, wherein said substrate is a silicon substrate.

8. The method of claim 1, wherein said first and third layers of epi semiconductor material are comprised of one of a III-V material, InGaAs, GaAs, InAs, SiGe or InSbAs.

9. The method of claim 1, wherein performing said at least one process operation comprises performing at least one chemical mechanical polishing process.

10. The method of claim 1, wherein all of said plurality of epitaxial deposition processes are performed prior to performing said at least one process operation.

11. The method of claim 1, wherein said method comprises:

performing one of said plurality of epitaxial deposition processes to form said first layer of epi semiconductor material around said exposed portion of said fin;

removing a portion of said first layer of epi semiconductor material from above said upper surface of said fin; and after removing said portion of said first layer of epi semiconductor material, forming said second and third layers of epi semiconductor material.

12. The method of claim 1, wherein said method comprises:

performing one of said plurality of epitaxial deposition processes to form said first layer of epi semiconductor material around said exposed portion of said fin;

removing a portion of said first layer of epi semiconductor material from above said upper surface of said fin;

after removing said portion of said first layer of epi semiconductor material, performing another of said plurality of epitaxial deposition processes to form said second layer of epi semiconductor material on said first layer of epi semiconductor material and said fin;

removing a portion of said second layer of epi semiconductor material from above said upper surface of said fin; and after removing said portion of said second epi semiconductor material, forming said third layer of epi semiconductor material.

13. The method of claim 1, wherein said method comprises:

performing at least two of said plurality of epitaxial deposition processes to form said first and second layers of epi semiconductor material around said exposed portion of said fin;

removing portions of said first and second layers of epi semiconductor material from above said upper surface of said fin; and after removing said portions of said first and second layers of epi semiconductor material, forming said third layer of epi semiconductor material.

14. A method, comprising:

forming a plurality of trenches in a semiconductor substrate so as to define a fin;

performing a first epitaxial deposition process to form a first layer of epi semiconductor material on an exposed portion of said fin;

performing a second epitaxial deposition process to form a second layer of epi semiconductor material on said first layer of epi semiconductor material;

performing a third epitaxial deposition process to form a third layer of epi semiconductor material on said second layer of epi semiconductor material;

overfilling said trenches with a layer of insulating material;

performing at least one planarization process to remove at least said first, second and third layers of epi semiconductor material from above an upper surface of said fin so as to thereby expose said fin;

performing an etching process to selectively remove said fin relative to said first, second and third layers of epi semiconductor material so as to thereby define two fin structures comprised of said first, second and third layers of epi semiconductor material; and forming a gate structure around a portion of at least one of said fin structures comprised of said first, second and third layers of epi semiconductor material.

15. The method of claim 14, wherein said first and third layers of epi semiconductor material are made of the same semiconductor material.

16. The method of claim 14, wherein said first and third layers of epi semiconductor material are made of silicon germanium and they have a thickness of less than 5 nm.

17. The method of claim 14, wherein said first, second and third layers of epi semiconductor material are all silicon germanium material and wherein the germanium concentration in said first and third layers of epi semiconductor material is substantially the same and the germanium concentration in said second layer of epi semiconductor material is less than said germanium concentration in each of said first and third layers of epi semiconductor material.

18. The method of claim 14, wherein said first and third layers of epi semiconductor material are made of $SiGe_{0.45}$ and said second layer of epi semiconductor material is made of $SiGe_{0.25}$.

19. The method of claim 14, wherein said first and third layers of epi semiconductor material are each made of silicon, a silicon germanium material having a germanium concentration of 10% or less or a group III-V material.

20. The method of claim 14, wherein said first and third layers of epi semiconductor material are comprised of one of a III-V material, InGaAs, GaAs, InAs, SiGe or InSbAs.

21. The method of claim 14, wherein performing said at least one planarization process comprises performing at least one chemical mechanical polishing process.

* * * * *